United States Patent [19]
He et al.

[11] Patent Number: 6,146,944
[45] Date of Patent: *Nov. 14, 2000

[54] LARGE ANGLE IMPLANTATION TO PREVENT FIELD TURN-ON UNDER SELECT GATE TRANSISTOR FIELD OXIDE REGION FOR NON-VOLATILE MEMORY DEVICES

[75] Inventors: Yue-Song He, San Jose; Che-Hoo Ng, San Martin; Pau-Ling Chen, Saratoga, all of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/039,783

[22] Filed: Mar. 16, 1998

[51] Int. Cl.$^7$ .................................................. H01L 21/8247
[52] U.S. Cl. .......................... 438/258; 438/525; 438/298
[58] Field of Search .................................... 438/257–267, 438/525, 450, 298

[56] References Cited

U.S. PATENT DOCUMENTS

| 5,190,887 | 3/1993 | Tang et al. | |
|---|---|---|---|
| 5,240,874 | 8/1993 | Roberts . | |
| 5,432,107 | 7/1995 | Uno et al. . | |
| 5,439,835 | 8/1995 | Gonzalez . | |
| 5,556,798 | 9/1996 | Hong . | |
| 5,624,859 | 4/1997 | Liu et al. | 438/298 |
| 5,786,265 | 7/1998 | Hwang et al. | 438/450 |
| 5,851,886 | 12/1998 | Peng | 438/289 |

*Primary Examiner*—Richard Booth
*Attorney, Agent, or Firm*—Fliesler Dubb Meyer & Lovejoy

[57] ABSTRACT

A P-type dopant is implanted into a substrate region 94 under a select drain gate transistor field oxide region 75 at a large tilt angle α, to prevent field turn-on under the select drain gate transistor field oxide region 75 in a non-volatile memory device such as a NAND flash memory device. A substrate region 114 under a select source gate transistor field oxide region 77 can also be implanted with a P-type dopant to prevent field turn-on under the region 77 if select source gates 90 and 92 are to be supplied with a voltage in operation rather than grounded. The substrate regions 94 and 114 under both the select drain gate transistor field oxide region 75 and the select source gate transistor field oxide region 77 can be implanted with the P-type dopant using a fixed-angle ion beam 120, by rotating the wafer 124 between the step of implanting one of the substrate regions and the step of implanting the other region.

83 Claims, 7 Drawing Sheets

LARGE ANGLE IMPLANTATION TO PREVENT FIELD TURN-ON UNDER SELECT GATE TRANSISTOR FIELD OXIDE REGION FOR NON-VOLATILE MEMORY DEVICES

TECHNICAL FIELD

The present invention relates to a method of fabricating a non-volatile memory device, and more particularly, to a method of fabricating a NAND non-volatile memory device.

BACKGROUND ART

Non-volatile memory devices have been developed by the semiconductor integrate circuit industry for various applications such as computers and digital communications. Examples of non-volatile memory devices include conventional flash electronically erasable programmable read-only memories (EEPROMs). A typical non-volatile memory device includes an array of NAND gates. A conventional NAND gate typically has a dual gate structure which includes a thin tunnel oxide layer between two field oxide portions on a substrate, a polysilicon floating gate which comprises a first polysilicon (POLY-1) layer on the tunnel oxide layer, a dielectric stack on the floating gate, and a polysilicon control gate which comprises a second polysilicon (POLY-2) layer on the dielectric stack. The dual gate structure of a conventional NAND flash memory device with POLY-1 and POLY-2 layers separated by an interpolysilicon dielectric stack is known to a person skilled in the art.

FIG. 1 shows a typical circuit diagram of an array of NAND flash memory gates 2a, 2b, 4a, 4b, 6a and 6b as part of a non-volatile memory device on a semiconductor integrated circuit. The NAND gates 2a, 2b, 4a, 4b, 6a and 6b each have a dual gate structure with a polysilicon floating gate and a polysilicon control gate. The NAND gates 2a and 2b, which are connected together in series in column 2 in the array of NAND gates, are connected to a select drain gate 2c and a select source gate 2d in the same column 2. In a similar manner, the NAND gates 4a and 4b in column 4 are connected to a select drain gate 4c and a select source gate 4d in the same column 4.

The NAND gates 2a and 4a are arranged in the same row with a control line 7 connected to the control gates of the NAND gates 2a and 4a. Similarly, the NAND gates 2b and 4b are arranged in the same row, with their control gates connected to another control line 8. The select drain gates 2c, 4c, 6c and the select source gates 2d, 4d, 6d each have only one polysilicon gate layer which can be implemented on a substrate as a first polysilicon (POLY-1) layer. The select drain gates 2c, 4c and 6c are connected in the same row by a single strip of POLY-1 layer across the row of select drain gates 2c, 4c and 6c. In a similar manner, the select source gates 2d, 4d and 6d are connected together by a single strip of POLY-1 layer 12 across the row of select source gates 2d, 4d and 6d.

FIG. 2 is a simplified plan view of the NAND flash memory of FIG. 1 implemented on a semiconductor substrate 14. A first polysilicon (POLY-1) layer 16 is deposited on the substrate 14 and then etched to form the pattern as shown in FIG. 2. A photoresist mask 18 is patterned and provided on the POLY-1 layer 16 before the POLY-1 layer 16 is etched by using a conventional etch such as a plasma etch to form the pattern as shown in FIG. 2. After the etching of the POLY-1 layer 16, channel stop implant windows 21 and 23 are formed on top of field oxide regions 20 and 22, respectively. For the purpose of illustration only, FIG. 2 shows the locations of the floating gates of the NAND gates 2a, 2b, 2c, 4a, 4b, 4c, 6a, 6b and 6c disposed along the respective column strips 2, 4 and 6 after the depositing and etching of a second polysilicon (POLY-2) layer (not shown) are completed. Further, FIG. 2 illustrates a row strip 10 which is connected across the select drain gates 2c, 4c and 6c, and another row strip 12 which is connected across the select source gates 2d, 4d and 6d.

Prior to the step of depositing the POLY-1 layer 16 on the substrate 14, an oxide layer is provided on the substrate 14. A cross-sectional view of the NAND flash memory of FIG. 2 obtained by a sectional cut along the sectional line 101a–101b is shown in FIG. 3, with core field oxide regions 20 and 22 disposed between adjacent POLY-1 layer strips 2, 4 and 6, which are also called bit lines in a flash memory device. The NAND flash memory also includes very thin tunnel oxide layers 24, 26 and 28 beneath the POLY-1 layer 16 of the NAND gate strips 2, 4 and 6, respectively. The core field oxide regions 20 and 22 between the NAND gate strips 2, 4 and 6 are usually much thicker than the tunnel oxide layers 24, 26 and 28. The fabrication of the silicon substrate 14, the core field oxide regions 20 and 22, the tunnel oxide layers 24, 26 and 28, and the POLY-1 layer 16 is conventional and known to a person skilled in the art.

Referring back to the plan view of FIG. 2, the field oxide regions 20 and 22 are shown as core field oxide strips 20 and 22, which are exposed through the respective channel stop implant windows 21 and 23. The control lines 7 and 8, also called word lines, which are shown as strips indicated by dashed lines, have not yet been formed on the NAND gate structure during the patterning and etching of the POLY-1 layer 16, and are shown for the purpose of illustration only. The areas in which the control lines 7 and 8 overlap the vertical strips 2, 4 and 6 of the POLY-1 layer 16 in the plan view of FIG. 2 define the control gates and the floating gates, respectively, of the NAND gates 2a, 4a, 6a, 2b, 4b and 6b. The control lines 7 and 8 may be provided by depositing, patterning and etching a second polysilicon (POLY-2) layer (not shown) after providing an interpolysilicon dielectric structure such as an oxide-nitride-oxide (ONO) trilayer structure (not shown) on the POLY-1 layer 16. However, since the select drain gates 2c, 4c and 6c and the select source gates 2d, 4d and 6d are formed by a single polysilicon (POLY-1) layer 16, no control lines are provided on top of the select drain gate strip 10 and the select source gate strip 12.

The core field oxide region 20 extends beneath the select drain gate strip 10 and the select source gate strip 12 as select drain gate and select source gate transistor field oxide regions 30 and 32, respectively. Similarly, the core field oxide region 22 extends under the select drain gate strip 10 and the select source gate strip 12 as field oxide regions 34 and 36, respectively. The edges 31, 33 and 34, 36 of the respective channel stop implant windows 21 and 23 are located adjacent the respective edges 38 and 44 of the select drain gate strip 10 and the select source gate strip 12. The edge 38 of the select drain gate strip 10 is separated by a narrow spacing 40 from the edge 31 of the channel stop implant window 21 which exposes the core field oxide region 20. Another spacing 42 exists between the edge 44 of the select source gate strip 12 and the edge 33 of the channel stop implant window 21 which exposes the core field oxide region 20.

The dimensions of the NAND non-volatile memory devices have been aggressively shrunk down in recent years in order to provide larger scale integration. When the dimension of the device is shrunk down to a very small size, the channel stop implant window is subjected to a "rounding affect" which enlarges the effective spacing between the edge 38 of the select drain gate strip 10 and the channel stop implant window 21 relative to the size of the select drain gate strip 10 and the core field oxide region 20. Attempts have been made to reduce the spacing 40 between the channel stop implant window 21 and the edge 38 of the select drain gate strip 10. The rounding of the edge 31 of the channel stop implant window 21 is shown in the enlarged plan view of FIG. 4. The spacing 40 may be further decreased to reduce the effective spacing due to the rounding effect. However, a disadvantage of reducing the spacing 40 between the channel stop implant window 21 and the edge 38 of the select drain gate strip 10 is that a part of the select drain gate strip 10 of the POLY-1 layer 16 may be etched if there is a misalignment between the core field oxide region 20 and the select drain gate strip 10 or when the spacing 40 is reduced to a very small size approaching zero.

FIG. 5 shows an enlarged plan view of a NAND flash memory device in which a misalignment between the core field oxide region 20 and the select drain gate strip 10 results in an overlapping of the channel stop implant window 21 and the select drain gate strip 10. In this case, a portion 46 of the select drain gate strip 10 is etched because the channel stop implant window 21 overlaps the edge 38 of the select drain gate strip 10 and "eats into" the portion 46 of the select drain gate strip 10. Since the width of the select drain gate strip 10 is reduced by the portion 46, which has been etched away, a high resistance is introduced by the narrower segment of the strip 10 of the POLY-1 layer 16 between the adjacent select drain gates 2c and 4c. Decreasing the spacing between the channel stop implant window 21 and the select drain gate strip 10 thus may cause process control problems resulting in a high resistance, which is undesirable, between the select drain gates 2c and 4c on the POLY-1 layer 16. Therefore, there is a need for a method of fabricating a NAND non-volatile memory device without the necessity of aggressively shrinking the spacing between the channel stop implant window and the select drain gate strip such that the risk of undesirably etching at least a portion of the select drain gate strip can be avoided.

Another problem associated with a conventional NAND non-volatile memory device is that the field region under the select drain gates may undesirably "turn on" due to a low field turn-on voltage which results from a low doping concentration under the select drain gate strip in a conventional NAND non-volatile memory device. When a field turn-on occurs, an excess leakage current will flow between the bit lines, thereby causing product failure. The field turn-on may occur even if the spacing between the channel stop implant window and the edge of the select drain gate strip is small enough and even if the problem of misalignment due to process control variations is avoided. Therefore, there is a further need to increase the field threshold voltage of the select drain gates such that a field turn-on can be avoided under normal operating conditions.

DISCLOSURE OF THE INVENTION

The present invention satisfies these needs. In accordance with the present invention, a method of fabricating a non-volatile memory device generally comprises the steps of:

(a) providing a substrate;
(b) providing a field oxide on the substrate, the field oxide including a select gate transistor field oxide region and a core field oxide region having a field oxide surface;
(c) providing a polysilicon layer on the select gate transistor field oxide region; and
(d) implanting a P-type dopant into the substrate below the select gate transistor field oxide region at a tilt angle with respect to the field oxide surface.

The P-type dopant may be implanted into the substrate region under the select gate transistor field oxide region at a tilt angle in the range of 8° to 88°, and may be implanted with a tilt angle in the range of 35° to 65°, which results in a desirable doping profile and doping concentration in the substrate region below the select gate transistor field oxide region for the select drain gates. The P-type dopant may be implanted into the substrate region below the select gate transistor field oxide region through the channel stop implant window, that is, the portion of the field oxide surface not covered by the polysilicon (POLY-1) layer which includes the select drain gate strip formed above the select gate transistor field oxide region. The large tilt angle implantation produces a relatively high concentration of the P-type dopant in the substrate region under the select drain gate transistor field oxide region.

In an embodiment, the P-type dopant comprises an element selected from Column III of the Periodic Table, that is, an element selected from the group consisting of boron (B), aluminum (Al), gallium (Ga), indium (In) and thallium (Tl). In many types of non-volatile memory devices which are fabricated on silicon substrates, boron (B) can be used as the P-type dopant. The P-type dopant can be implanted into the substrate region below the select drain gate transistor field oxide region using an ion beam directed to the field oxide surface at a tilt angle of at least 8° from the normal to the field oxide surface. The P-type dopant may also be implanted into the substrate region under the select drain gate transistor field oxide region by diffusing the P-type dopant into the substrate region.

Both the select drain gate strip and the select source gate strip may be formed on the substrate by depositing a polysilicon (POLY-1) layer, providing a patterned photoresist mask on the POLY-1 layer, and etching the POLY-1 layer. The POLY-1 layer is the only polysilicon layer necessary for forming the patterned strips of select drain gates and select source gates of the NAND non-volatile memory device.

In an additional embodiment, the method according to the present invention further comprises the step of implanting the P-type dopant into the substrate region below the select source gate transistor field oxide region to produce a desired doping profile and doping concentration in the substrate region. In NAND non-volatile memory applications in which the select source gates are grounded, the step of implanting the P-type dopant into the substrate region under the select source gate transistor field oxide region is optional.

In the embodiment in which the substrate regions below both select drain gate and select source gate transistor field oxide regions are implanted with a P-type dopant at a tilt angle with respect to the field oxide surface, the method according to the present invention may further comprise the step of rotating the semiconductor wafer by about 180° between the step of implanting the P-type dopant into the substrate region below the select drain gate transistor field oxide region and the step of implanting the P-type dopant into the substrate region below the select source gate transistor field oxide region. The substrate region below either the select drain gate transistor field oxide region or the select source gate transistor field oxide region may be implanted with the P-type dopant before the step of rotating the wafer, such that both substrate regions can be implanted at the same tilt angle without the need for redirecting the ion beam by the ion implantation machine.

Advantageously, the present invention provides a method of fabricating a non-volatile memory device, and more particularly, a NAND device with a P-type dopant implanted at a large tilt angle into the substrate region below the select gate transistor field oxide region to increase the dopant concentration in the substrate region, thereby increasing the field threshold voltage for preventing a field turn-on of the select drain gates along the select drain gate strip more effectively than in conventional NAND flash memory devices. Moreover, the method according to the present invention obviates the need for significantly reducing the spacing between the channel stop implant window and the edge of the select drain gate strip even though the overall device dimension has been aggressively shrunk down, thereby preventing process control problems that may result in a misalignment between the select drain gate strip and the core field oxide region which may cause the channel stop implant window to eat into the select drain gate strip, such that an undesirably high resistance through the select drain gate strip can be avoided.

BRIEF DESCRIPTION OF THE DRAWINGS

The present invention will be described with respect to particular embodiments thereof, and references will be made to the drawings in which.

MODES FOR CARRYING OUT THE INVENTION

The present invention provides a method of making a non-volatile memory device that exhibits the characteristic of a high field threshold voltage for preventing a field turn-on under the select gate transistor field oxide region under normal operating conditions. Moreover, the method according to the present invention allows for a sufficiently large spacing between the channel stop implant window and the edge of the select gate strip to avoid the process control problem of misalignment and the partial etching of the select gate strip.

Figure 1:
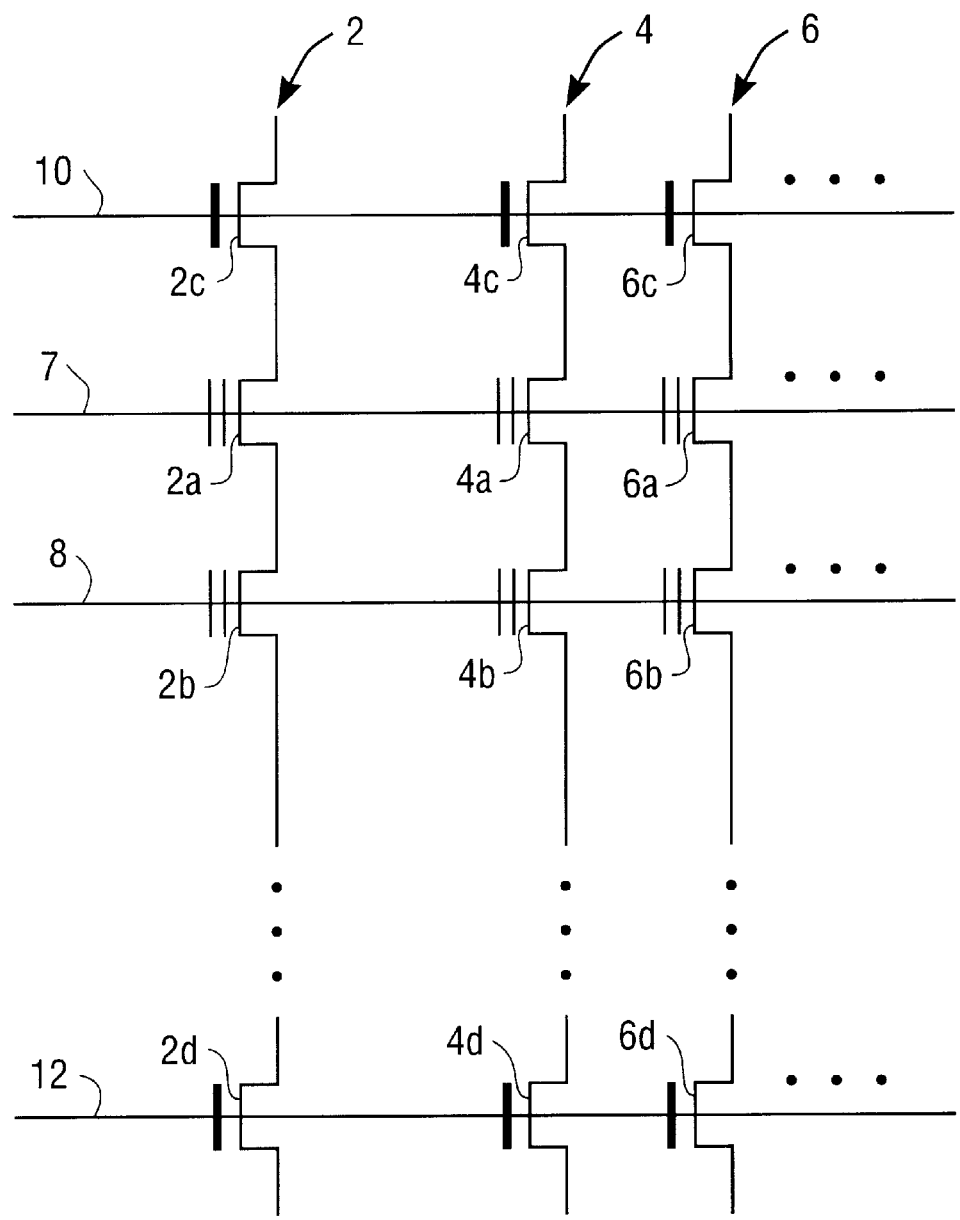
FIG. 1, described above, is a simplified circuit diagram of a typical NAND non-volatile memory device including an array of NAND gates, a row of select drain gates and a row of select source gates.
Figure 2:
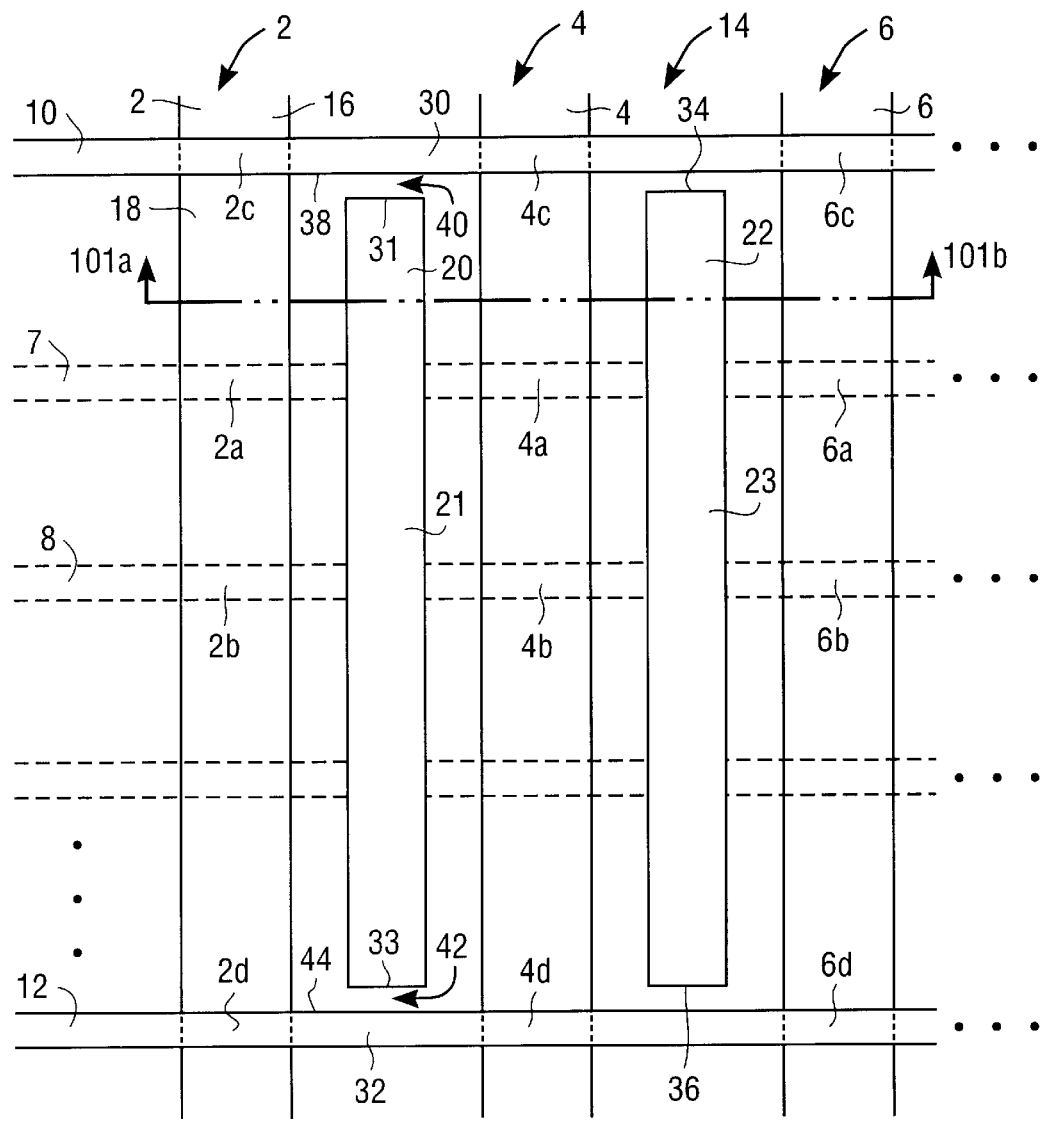
FIG. 2, described above, is a simplified plan view of the non-volatile memory device of FIG. 1 with a patterned polysilicon layer and core field oxide regions on the substrate of a semiconductor wafer.
Figure 3:
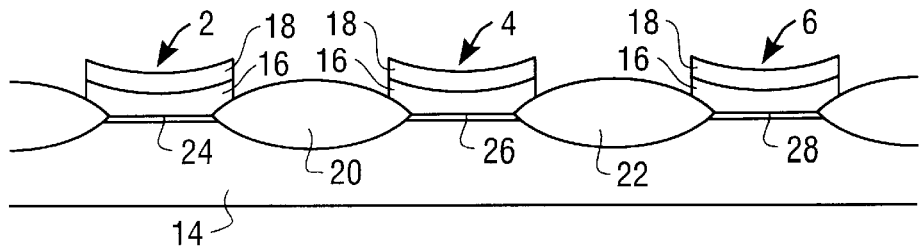
FIG. 3, described above, is a cross-sectional view of the non-volatile memory device of FIG. 2 obtained by a sectional cut along sectional line 101*a*–101*b*.
Figure 4:
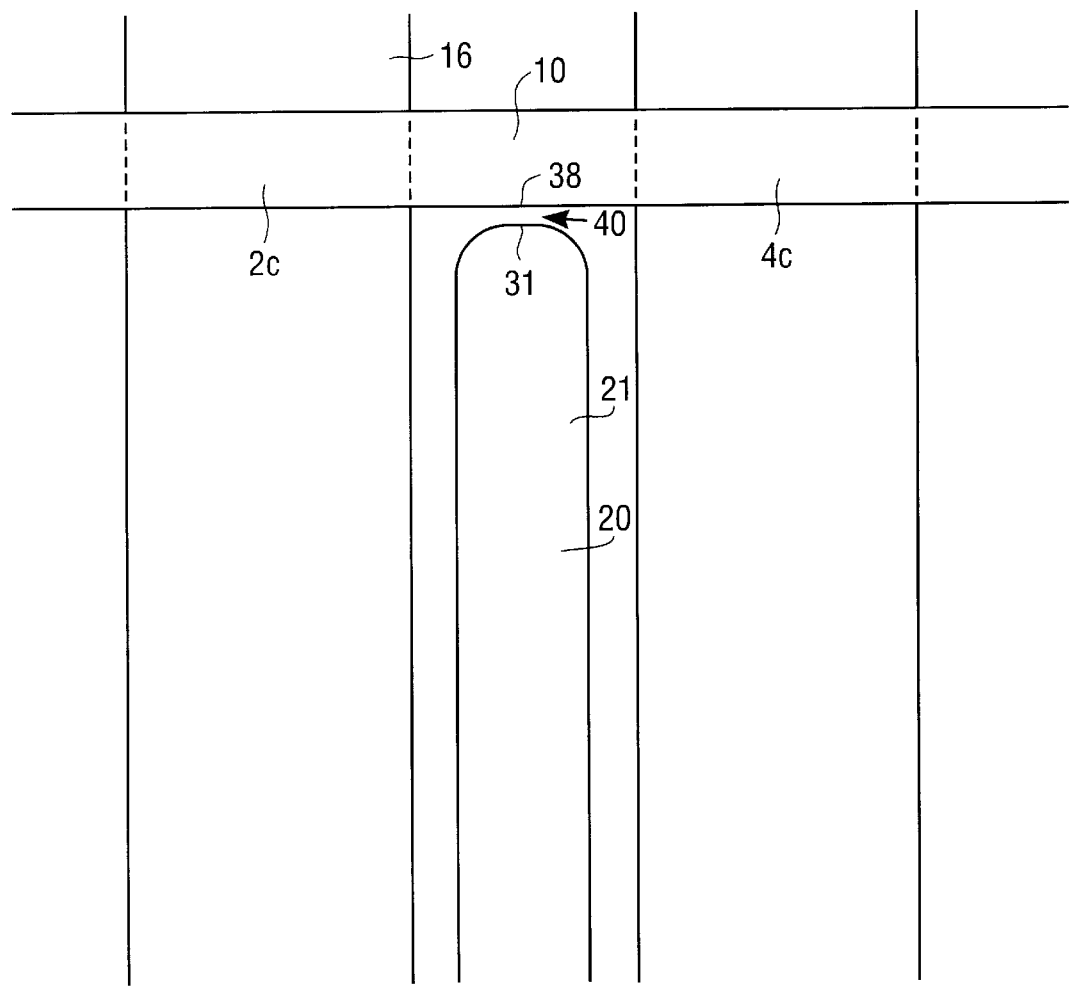
FIG. 4, described above, is an enlarged plan view of the non-volatile memory device of FIG. 2 illustrating the rounding effect on the channel stop implant window when the spacing between the channel stop implant window and the edge of the select drain gate strip is small.
Figure 5:
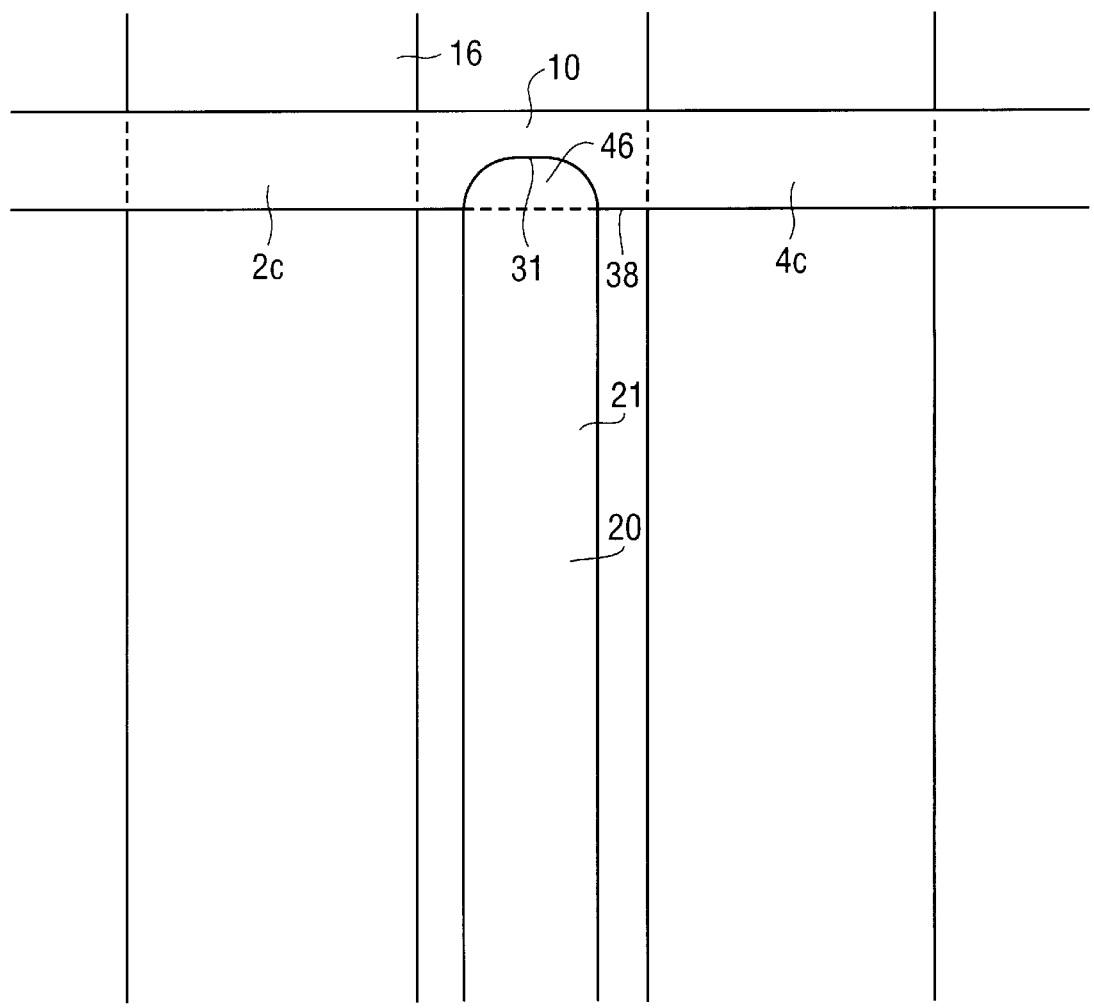
FIG. 5, described above, is an enlarged plan view of the non-volatile memory device illustrating a misalignment between the core field oxide region and the polysilicon layer resulting in a partial etching of the select drain gate strip.
Figure 6:
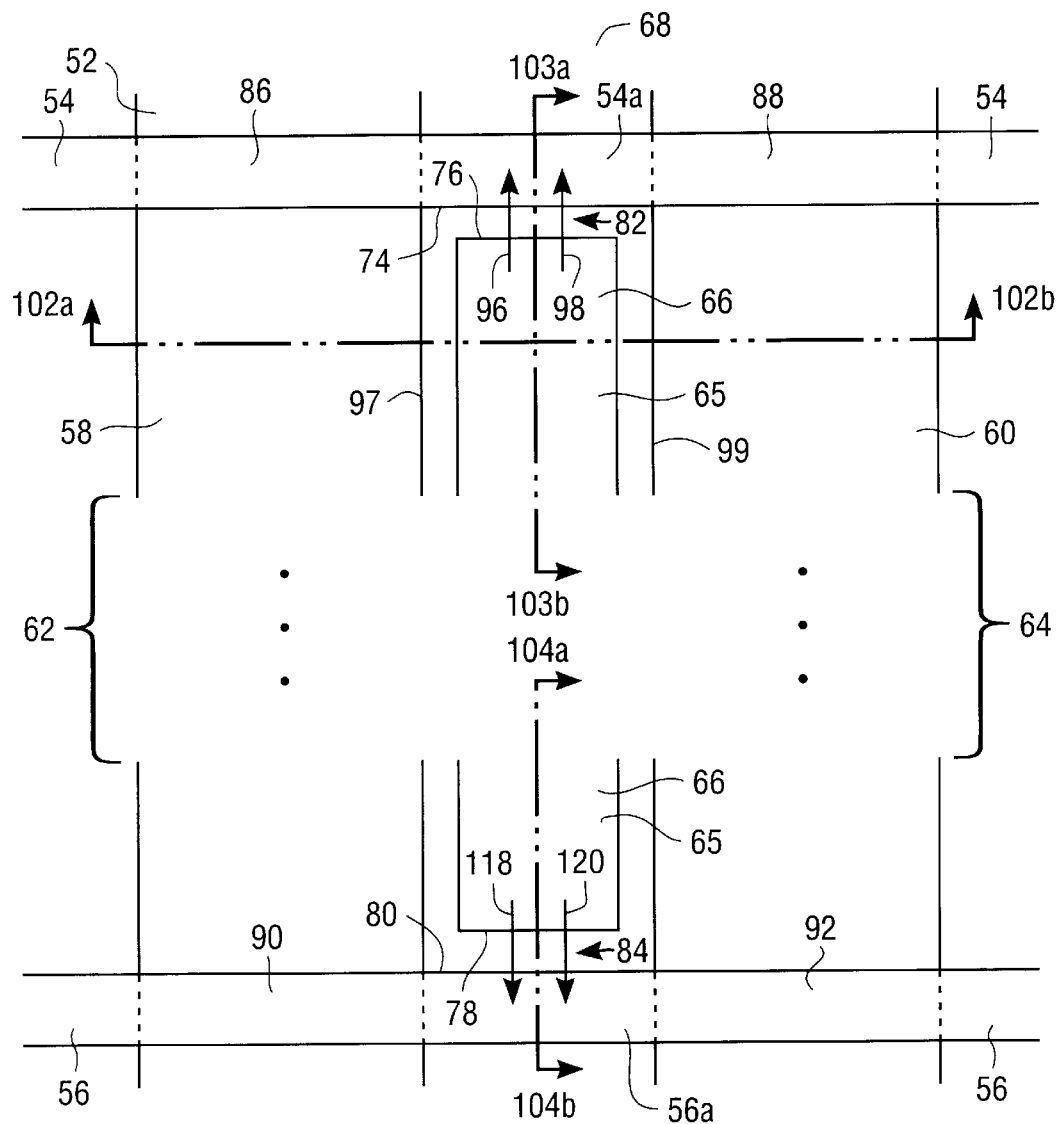
FIG. 6 is a simplified plan view of a portion of the non-volatile memory device fabricated according to the method of the present invention.

FIG. 6 is a simplified plan view of a non-volatile memory device fabricated according to the method of the present invention in which a channel stop implant window 65 is etched from a polysilicon (POLY-1) layer 52. For the purpose of illustration only, FIG. 6 shows a select drain gate strip 54, a select source gate strip 56, and column strips 58 and 60 which are formed after the depositing and etching of a second polysilicon (POLY-2) layer to complete the dual gate structure of conventional NAND gates. The column strips 58 and 60 are perpendicular to the select drain gate strip 54 and the select source gate strip 56. The column strips 58 and 60 form respective bit lines for the non-volatile memory device. A plurality of non-volatile memory gates such as NAND gates are disposed along the bit lines 58 and 60 in a manner similar to that which is described above in "Background Art" and shown in FIG. 2. The NAND gates, each having a conventional dual gate structure, can be fabricated by using a conventional method known to a person skilled in the art and are not the subject matter of the present invention. The NAND gates are therefore omitted in the simplified plan view of FIG. 6, and the sections of bit lines 58 and 60 upon which the conventional NAND gates are disposed are generically indicated by segments 62 and 64, respectively, in FIG. 6.

Figure 7:
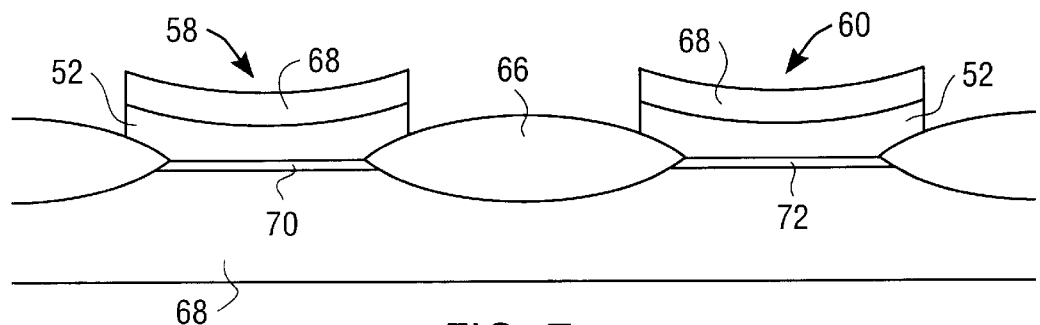
FIG. 7 is a cross-sectional view of the non-volatile memory device of FIG. 6 fabricated according to the method of the present invention obtained by a sectional cut along sectional line 102*a*–102*b*.

FIG. 6 also shows a core field oxide region 66 which is grown on a substrate 68 and exposed by the channel stop implant window 65. Referring to FIG. 7, which is a cross-sectional view of the non-volatile memory device fabricated according to the method of the present invention obtained by a sectional cut along sectional line 102*a*–102*b* in FIG. 6, the field oxide has a pattern of varying thicknesses across the semiconductor wafer upon which the substrate 68 is provided. The core field oxide region 66 is disposed between the adjacent bit lines 58 and 60 of the POLY-1 layer 52. FIG. 7 also shows a patterned layer of a photoresist mask 68 on top of the POLY-1 layer 52. Underneath the bit lines 58 and 60 in the NAND gate regions are very thin tunnel oxide layers 70 and 72 which are disposed between adjacent core field oxide regions. The photoresist mask 68 may be left on top of the POLY-1 layer 52 when the P-type dopant is implanted into the substrate regions below the select gate transistor field oxide regions in accordance with the present invention.

Referring back to FIG. 6, the core field oxide region 66 is disposed on the substrate 68 as a field oxide strip in parallel with and between the bit lines 58 and 60 of the POLY-1 layer 52. The field oxide strip 66 is exposed by the channel stop implant window 65 which has edges 76 and 78 adjacent the edges 74 and 80 of the select drain gate strip 54 and the select source gate strip 56, respectively. The edges 76 and 78 of the channel stop implant window 65 are separated by narrow spacings 82 and 84, respectively, from the edge 74 of the select drain gate strip 54 and the edge 80 of the select source gate strip 56. The select drain gate strip 54 includes a strip segment 54a which connects the POLY-1 layer regions of adjacent select drain gates 86 and 88 on the respective bit lines 58 and 60 of the POLY-1 layer 52. In a similar manner, the select source gate strip 56 includes a strip segment 56a which connects the POLY-1 layer regions of adjacent select source gates 90 and 92 on the respective bit lines 58 and 60 of the POLY-1 layer 52.

Figure 8:
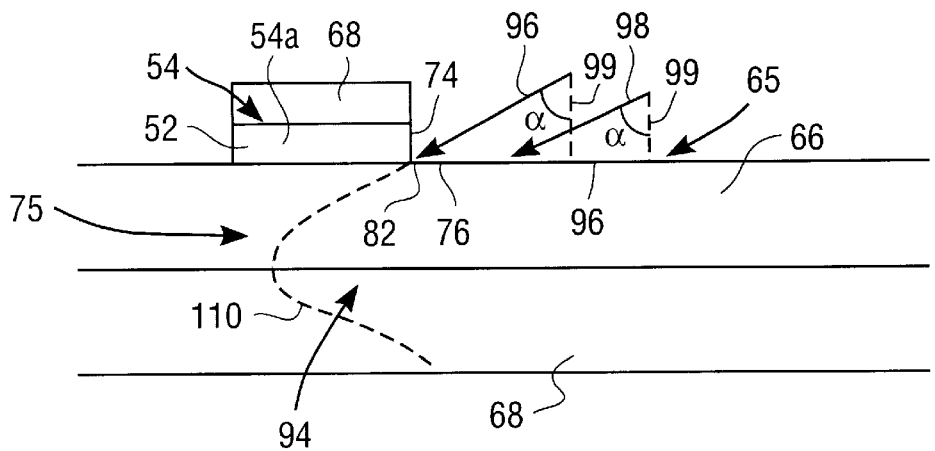
FIG. 8 is another cross-sectional view of the non-volatile memory device of FIG. 6 fabricated according to the method of the present invention obtained by a sectional cut along sectional line 103*a*–103*b*, showing the tilt angle of the implantation of a P-type dopant into the substrate region under the select drain gate transistor field oxide region.

FIG. 8 is a cross-sectional view of the non-volatile memory device fabricated according to the method of the present invention, obtained by a sectional cut along sectional line 103a–103b in FIG. 6. FIG. 8 shows the core field oxide region 66 which extends beyond the edge 76 of the channel stop implant window 65 adjacent the edge 74 of the select drain gate strip segment 54a of the POLY-1 layer 52 to form a select drain gate transistor field oxide region 75 under the select drain gate strip segment 54a. The edge 74 of the select drain gate strip segment 54a is separated from the edge 76 of the channel stop implant window 65 by a drain spacing 82 on the surface 96 of the substrate 68.

A P-type dopant, for example boron (B), is implanted into the region 94 of the substrate 68 under the select drain gate transistor field oxide region 75, which is beneath the select drain gate strip segment 54a of the POLY-1 layer 52. The P-type dopant is implanted at a tilt angle into the substrate region 94 under the select drain gate transistor field oxide region 75 to increase the dopant concentration of the P-type dopant under the select drain gate transistor field oxide region 75, in order to prevent the field turn-on of the select drain gates along the select drain gate strip 54 such that a field turn-on of the select drain gates can be avoided under normal operating conditions.

The P-type dopant can be implanted through the field oxide surface 96 into the substrate region 94 under the select drain gate transistor field oxide region 75 by a conventional implantation method such as ion implantation, with the direction of the ion beam indicated by arrows 96 and 98. The P-type dopant is implanted at a tilt angle α with respect to the normal indicated by dashed line 99 to the surface 96 of the field oxide 66 such that the substrate region 94 below the select drain gate transistor field oxide region 75 is doped with the P-type dopant. The P-type dopant can be implanted through the select gate transistor field oxide region 75 below the select drain gate strip 54 into the substrate region 94. In the plan view of FIG. 7, the arrows 96 and 98 indicating the direction of implantation of the P-type dopant are shown as being parallel to the edges 97 and 99 of the bit lines 58 and 60, respectively.

The P-type dopant may be implanted into the substrate region 94 with a large tilt angle α in the range of 8° to 88° with respect to the normal 99 to the field oxide surface 96. To obtain the doping profile in indicated by dashed curve 110 in the substrate region 94 under the select drain gate transistor field oxide region 75, a large tilt angle α in the range of 35° to 65° may be provided in the process of large angle implantation. During the doping of the substrate region 94 under the select drain gate transistor field oxide region 75 with the P-type dopant, a very narrow and nearly parallel ion beam produced by a parallel beam ion implantation machine may be used to implant the P-type ions through the field oxide surface 96 into the substrate region 94. The ions that strike the surfaces of the POLY-1 layer 52 and the photoresist mask 68 are bounced off these surfaces because the ions cannot penetrate through the POLY-1 layer 52 or the photoresist mask 68 into the substrate region 94 under the select drain gate transistor field oxide region 75. Although boron (B) can be used as the P-type dopant in the fabrication of silicon based non-volatile memory devices, other types of materials selected from the elements in Column III of the Periodic Table, such as aluminum (Al), gallium (Ga), indium (In) and thallium (Tl) may also be used as the P-type dopants in the method according to the present invention. Although ion implantation can be used for implanting the P-type dopant into the substrate region 94 in the fabrication of non-volatile memory devices, other conventional doping methods such as diffusion can also be used to implant the P-type dopant into the substrate region 94 under the select drain gate transistor field oxide region 75. Ion implantation is usually capable of providing better process control and better directivity in the large angle implantation of the P-type dopant into the substrate region 94 than the process of diffusion is able to provide.

To obtain a desired doping profile such as that indicated by the dashed curve 110 in FIG. 8, a tilt angle α in the range of 35° to 65°, or more particularly, at about 45° may be used in the process of ion implantation. The P-type dopant can be implanted through the select drain gate transistor field oxide region 75 into the substrate region 94 with an implant energy typically in the range of 80 keV to 120 keV and an implant dose in the range of $3 \times 10^{13}$ cm$^{-2}$ to $4 \times 10^{13}$ cm$^{-2}$. Other implant energies and doses may also be used to achieve different doping profiles of the P-type dopant in the substrate region 94 under the select drain gate transistor field oxide region 75. Other tilt angles can also be selected to achieve different doping profiles in the substrate region 94.

Figure 9:
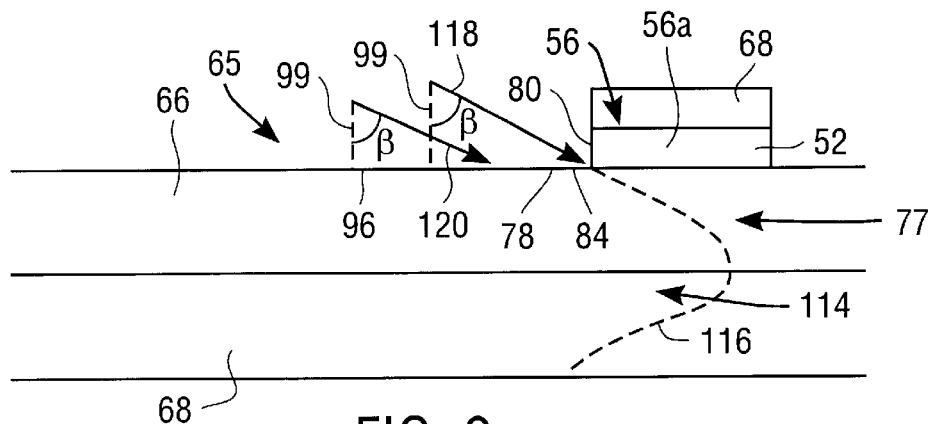
FIG. 9 is another cross-sectional view of the non-volatile memory device of FIG. 6 fabricated according to the method of the present invention obtained by a sectional cut along sectional line 104*a*–104*b*.

FIG. 9 is another sectional view of the non-volatile memory device fabricated according to the method of the present invention, obtained by a sectional cut along sectional line 104a–104b in FIG. 6. FIG. 9 shows the select source gate strip segment 56a of the POLY-1 layer 52 and the patterned photoresist mask 68 on top of the POLY-1 layer 52. The core field oxide region 66 has a field oxide surface 96 with a channel stop implant window 78 adjacent the edge 80 of the select source gate strip segment 56a. The edge 80 of the select source gate strip segment 56a is separated from the edge 78 of the channel stop implant window 65 by a source spacing 84 on the field oxide surface 96. The core field oxide region 66 extends beyond the edge 78 of the channel stop implant window 65 adjacent the edge 80 of the select source gate strip segment 56a to form a select source gate transistor field oxide region 77 under the select source gate strip segment 56a.

In a manner similar to that of the large angle implantation of a P-type dopant into the substrate region 94 under the select drain gate transistor field oxide region 75 as shown in FIG. 8 and described above, a P-type dopant such as boron (B) is implanted through the field oxide surface 96 into the region 114 of the substrate 68 below the select source gate transistor field oxide region 77 at a tilt angle β with respect to the normal 99 to the field oxide surface 96. The doping profile of the P-type dopant is illustrated by dashed curve 116 in the substrate region 114 under the select source gate transistor field oxide region 77. Arrows 118 and 120 indicate the direction of the ion beam when the P-type dopant is implanted into the substrate region 114 by ion implantation. Although ion implantation can be used for doping the substrate in the fabrication of silicon based non-volatile memory devices, other conventional doping methods such as diffusion can also be used. In addition to boron (B), which can be used as the P-type dopant in many silicon based semiconductor applications, other elements in Column III of the Periodic Table including aluminum (Al), gallium (Ga), indium (In) and thallium (Tl) may also be used as the P-type dopant.

In many non-volatile memory applications, and more particularly in applications in which NAND devices are typically used, the source gates are usually grounded whereas the drain gates are supplied with a positive voltage. In these cases, only the substrate region 94 underneath the select drain gate transistor field oxide region 75 need be doped with a P-type dopant to increase the field threshold voltage to prevent the field turn-on of the select drain gates when they are supplied with a voltage. If, however, the select source gates are also to be supplied with a voltage other than zero in operation, doping of the substrate region 114 under the select source gate transistor field oxide region 77 may also be desirable to prevent the field turn-on of the select source gates under normal operating conditions. In general, the implantation of a P-type dopant into the substrate regions beneath the select drain gate and select source gate transistor field oxide regions is performed before an interpolysilicon layer such as an oxide-nitride-oxide (ONO) layer and a second polysilicon (POLY-2) layer are deposited and etched to form the NAND gates. The photoresist mask 68 may be left on top of the POLY-1 layer 52 prior to the step of implanting the substrate regions 94 and 114 beneath the select drain gate transistor field oxide region 75 and the select source gate transistor field oxide region 77, respectively.

Figure 10:
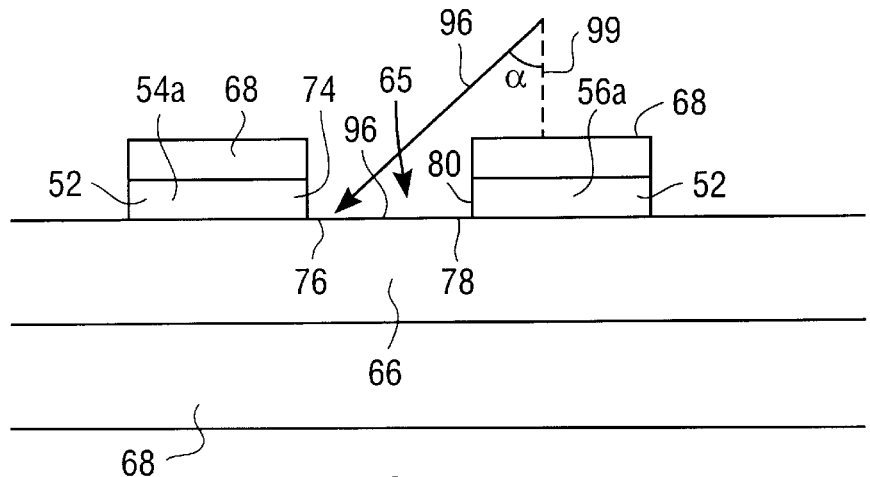
FIG. 10 is a cross-sectional view of another embodiment of the non-volatile memory device fabricated according to the method of the present invention showing the limitation of the maximum tilt angle by the presence of an adjacent gate.

FIG. 10 shows a cross-sectional view of a non-volatile memory device with the select drain gate strip segment 54a and the select source gate strip segment 56a in relative proximity of each other with a relatively short core field oxide strip 66. In this case, the tilt angle of the ion beam is limited by the distance between the edges 74 and 80 of the respective select gate strip segments 54a and 56a and the combined height of the stack of the POLY-1 layer 52 and the photoresist mask 68 above the field oxide surface 96. However, in many applications, the length of the core field oxide region 66 defined by the distance between the edges 76 and 78 of the channel stop implant window 65 is much greater than the combined height of the stack of the POLY-1 layer 52 and the photoresist mask 68. Therefore, in practice the tilt angle used in the implantation of the P-type dopant into the substrate region under either the select drain gate transistor field oxide region or the select source gate transistor field oxide region usually is not limited by the distance between the select drain gate strip and the select source gate strip.

The optimal tilt angle used in the implantation process is usually determined by the doping profile desired in the substrate region under either the select drain gate transistor field oxide region or the select source gate transistor field oxide region. Moreover, the angle of implantation used in the method according to the present invention need not be determined by consideration of the channeling effect of the crystal lattice structure of the substrate. Therefore, the tilt angle is determined by the desired doping profile and is independent of the lattice orientation of the substrate.

Figure 11:
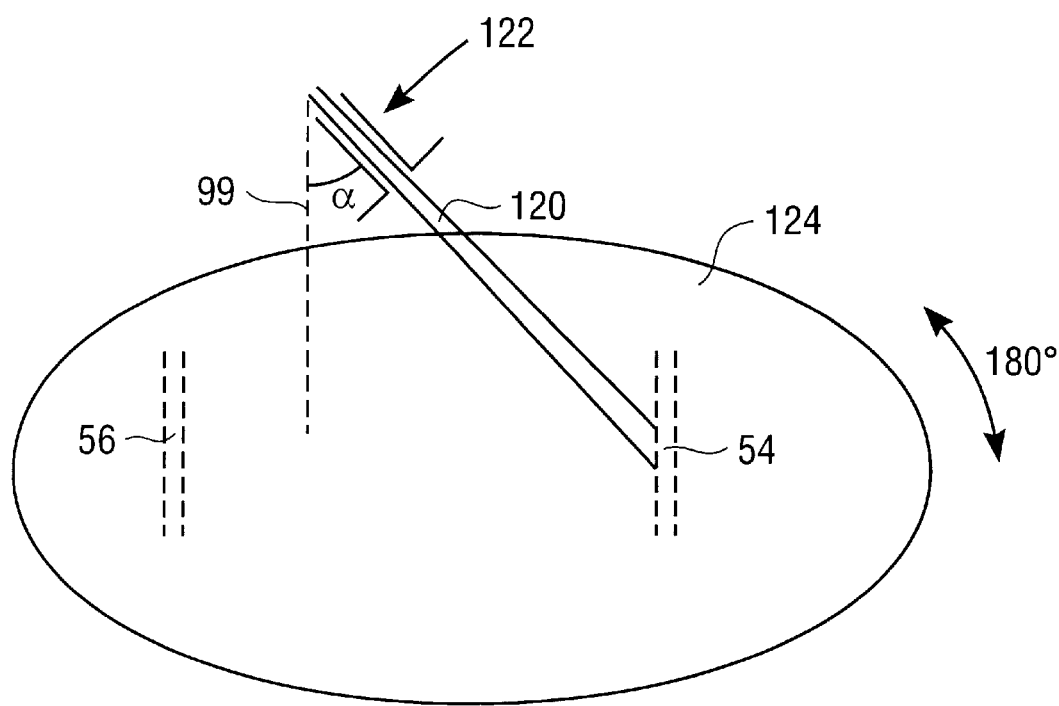
FIG. 11 is a simplified perspective view illustrating angled ion beam implantation with a fixed tilt angle and a wafer rotatable by 180° for the doping of substrate regions under both the select drain gate transistor field oxide region and the select source gate transistor field oxide region.

FIG. 11 illustrates a further embodiment of the method according to the present invention in which the substrate regions under both select drain gate and select source gate transistor field oxide regions are to be implanted with a P-type dopant. FIG. 11 shows a simplified perspective view in which an ion beam 120 is generated by an ion implantation machine (not shown) having beam forming electrodes 122 directed at a large tilt angle α with respect to the normal 99 to the surface of the wafer 124. The ion beam 120 strikes the surface of the wafer 124 upon which the select drain gate strip 54 and the select source gate strip 56 are formed. In an embodiment, the P-type dopant is implanted into the substrate region under the select drain gate transistor field oxide region by the angled ion beam 120, and after the substrate region under the select drain gate transistor field oxide region is doped with the P-type dopant, the semiconductor wafer 124 is rotated by about 180° in either direction before the P-type dopant is implanted into the substrate region under the select source gate transistor field oxide region.

Since the select drain gate strip 54 and the select source gate strip 56 are usually disposed opposite each other on the wafer 124 in a typical array of NAND flash memory gates, the doping of both substrate regions under the select drain gate and select source gate transistor field oxide regions can be achieved with a fixed-angle ion beam 120, by simply rotating the wafer 124 between the steps of implanting the two substrate regions. The substrate region under the select drain gate transistor field oxide region may be implanted with the P-type dopant before rotating the wafer 124 by about 180° and implanting the P-type dopant into the substrate region under the select source gate transistor oxide region. Alternatively, the substrate region under the select source gate transistor field oxide region may be implanted with the P-type dopant before rotating the wafer 124 and implanting the P-type dopant into the substrate region under the select drain gate transistor field oxide region. Therefore, the direction of the ion beam 120 need not be changed by the ion implantation machine to implant the P-type dopant into the two substrate regions, thereby simplifying the fabrication process.

INDUSTRIAL APPLICABILITY

The method according to the present invention is applicable for the fabrication of non-volatile memory devices including NAND flash memory devices. The method according to the present invention allows the select drain gates to possess the characteristic of a high field threshold voltage such that field turn-on under the select drain gate transistor field oxide region can be prevented under normal operating conditions. Moreover, the substrate region under the select source gate transistor field oxide region may also be implanted with a P-type dopant using large angle implantation to prevent field turn-on under the select source gate transistor field oxide region if the select source gates are to be supplied with a voltage in operation rather than grounded. Furthermore, the method according to the present invention obviates the need for drastically reducing the spacing between the channel stop implant window and the edge of the select gate strip, thereby avoiding the process control problems that potentially cause a misalignment between the core field oxide and the POLY-1 layer and partial etching of the select gate strip.

The invention has been described with respect to particular embodiments thereof, and numerous modifications can be made which are within the scope of the invention as set forth in the claims.

What is claimed is:

1. A method of fabricating a non-volatile memory, comprising the steps of:
   (a) providing a substrate;
   (b) providing a field oxide on the substrate, the field oxide including a select gate transistor field oxide region and a core field oxide region having a field oxide surface;
   (c) providing a polysilicon layer on the select gate transistor field oxide region; and (d) implanting a P-type dopant into the substrate below the select gate transistor field oxide region at a tilt angle of at least 8° with respect to the field oxide surface.

2. The method of claim 1, wherein the step of implanting the P-type dopant comprises the step of implanting the P-type dopant into the substrate below the select gate transistor field oxide region through the select gate transistor field oxide region.

3. The method of claim 1, wherein the step of implanting the P-type dopant comprises the step of implanting the P-type dopant into the substrate below the select gate transistor field oxide region through the field oxide surface.

4. The method of claim 1, further comprising the step of providing a photoresist mask on the polysilicon layer prior to the step of implanting the P-type dopant.

5. The method of claim 1, wherein the P-type dopant comprises boron (B).

6. The method of claim 1, wherein the P-type dopant comprises an element selected from the group consisting of boron (B), aluminum (Al), gallium (Ga), indium (In) and thallium (Tl).

7. The method of claim 1, wherein the step of implanting the P-type dopant comprises the step of ion implanting the P-type dopant into the substrate below the select gate transistor field oxide region.

8. The method of claim 1, wherein the step of implanting the P-type dopant comprises the step of diffusing the P-type dopant into the substrate below the select gate transistor field oxide region.

9. The method of claim 1, wherein the polysilicon layer comprises a select drain gate strip and a select source gate strip opposite the select drain gate strip, wherein the core field oxide region is disposed between the select drain gate strip and the select source gate strip, and wherein the select gate transistor field oxide region comprises a select drain gate transistor field oxide region below the select drain gate strip and a select source gate transistor field oxide region below the select source gate strip.

10. The method of claim 9, further comprising the step of etching the polysilicon layer to form the select drain gate strip and the select source gate strip.

11. The method of claim 9, wherein the step of implanting the P-type dopant comprises the step of implanting the P-type dopant into the substrate below the select drain gate transistor field oxide region at a tilt angle with respect to the field oxide surface.

12. The method of claim 11, wherein the step of implanting the P-type dopant further comprises the step of implanting the P-type dopant into the substrate below the select source gate transistor field oxide region at a tilt angle with respect to the field oxide surface.

13. The method of claim 12, wherein the select drain gate strip and the select source gate strip are disposed opposite each other on a semiconductor wafer, further comprising the step of rotating the semiconductor wafer by about 180° between the step of implanting the P-type dopant into the substrate below the select drain gate transistor field oxide region and the step of implanting the P-type dopant into the substrate below the select source gate transistor field oxide region.

14. The method of claim 1, wherein the tilt angle is between 35° and 65°.

15. The method of claim 1, wherein the substrate has a lattice orientation with respect to the field oxide surface, and wherein the tilt angle is independent of the lattice orientation.

16. The method of claim 1, wherein the non-volatile memory comprises a NAND device.

17. The method of claim 1, wherein the step of implanting the P-type dopant is performed with an implant energy between 80 KeV and 120 KeV.

18. The method of claim 1, wherein the step of implanting the P-type dopant is performed with an implant dose between $3 \times 10^{13}$ cm$^{-2}$ and $4 \times 10^{13}$ cm$^{-2}$.

19. A method of fabricating a non-volatile memory formed on a substrate, with a field oxide disposed on the substrate, the field oxide including a select gate transistor field oxide region and a core field oxide region having a field oxide surface, and a polysilicon layer disposed on the select gate transistor field oxide region, the method comprising the step of:

implanting a P-type dopant into the substrate below the select gate transistor field oxide region through the field oxide surface at a tilt angle of at least 8° with respect to the field oxide surface.

20. The method of claim 19, further comprising the step of providing a photoresist mask on the polysilicon layer prior to the step of implanting the P-type dopant.

21. The method of claim 19, wherein the P-type dopant comprises boron (B).

22. The method of claim 19, wherein the P-type dopant comprises an element selected from the group consisting of boron (B), aluminum (Al), gallium (Ga), indium (In) and thallium (Tl).

23. The method of claim 19, wherein the step of implanting the P-type dopant comprises the step of ion implanting the P-type dopant into the substrate below the select gate transistor field oxide region.

24. The method of claim 19, wherein step of implanting the P-type dopant comprises the step of diffusing the P-type dopant into the substrate below the select gate transistor field oxide region.

25. The method of claim 19, wherein the polysilicon layer comprises a select drain gate strip and a select source gate strip opposite the select drain gate strip, wherein the field oxide is disposed between the select drain gate strip and the select source gate strip, and wherein the select gate transistor field oxide region comprises a select drain gate transistor field oxide region below the select drain gate strip and a select source gate transistor field oxide region below the select source gate strip.

26. The method of claim 25, further comprising the step of etching the polysilicon layer to form the select drain gate strip and the select source gate strip.

27. The method of claim 25, wherein the step of implanting the P-type dopant comprises the step of implanting the P-type dopant into the substrate below the select drain gate transistor field oxide region at a tilt angle of at least 8° with respect to the field oxide surface.

28. The method of claim 27, wherein the step of implanting the P-type dopant further comprises the step of implanting the P-type dopant into the substrate below the select source gate transistor field oxide region at a tilt angle of at least 8° with respect to the field oxide surface.

29. The method of claim 28, wherein the select drain gate strip and the select source gate strip are disposed opposite each other on a semiconductor wafer, further comprising the step of rotating the semiconductor wafer by about 180° between the step of implanting the P-type dopant into the substrate below the select drain gate transistor field oxide region and the step of implanting the P-type dopant into the substrate below the select source gate transistor field oxide region.

30. The method of claim 19, wherein the tilt angle is between 35° and 65°.

31. The method of claim 19, wherein the substrate has a lattice orientation with respect to the field oxide surface, and wherein the tilt angle is independent of the lattice orientation.

32. The method of claim 19, wherein the non-volatile memory comprises a NAND device.

33. The method of claim 19, wherein the step of implanting the P-type dopant is performed with an implant energy between 80 KeV and 120 KeV.

34. The method of claim 19, wherein the step of implanting the P-type dopant is performed with an implant dose between $3 \times 10^{13}$ cm$^{-2}$ and $4 \times 10^{13}$ cm$^{-2}$.

35. A method of fabricating a non-volatile memory, comprising the steps of:
(a) providing a substrate;
(b) providing a field oxide on the substrate, the field oxide comprising a core field oxide region having a field oxide surface, a select drain gate transistor field oxide region and a select source gate transistor field oxide region;
(c) providing a polysilicon layer on the field oxide, the polysilicon layer comprising a select drain gate strip and a select source gate strip disposed opposite each other, the core field oxide region positioned between the select drain gate strip and the select source gate strip, the select drain gate strip positioned on the select drain gate transistor field oxide region, and the select source gate strip positioned on the select source gate transistor field oxide region; and
(d) implanting a P-type dopant into the substrate below the select drain gate transistor field oxide region at a tilt angle of at least 8° with respect to the field oxide surface.

36. The method of claim 35, wherein the step of implanting the P-type dopant comprises the step of implanting the P-type dopant into the substrate below the select drain gate transistor field oxide region through the select drain gate transistor field oxide region.

37. The method of claim 35, wherein the step of implanting the P-type dopant comprises the step of implanting the P-type dopant into the substrate below the select drain gate transistor field oxide region through the field oxide surface.

38. The method of claim 35, further comprising the step of providing a photoresist mask on the select drain gate strip prior to the step of implanting the P-type dopant.

39. The method of claim 35, wherein the P-type dopant comprises boron (B).

40. The method of claim 35, wherein the P-type dopant comprises an element selected from the group consisting of boron (B), aluminum (Al), gallium (Ga), indium (In) and thallium (Tl).

41. The method of claim 35, wherein the step of implanting the P-type dopant comprises the step of ion implanting the P-type dopant into the substrate below the select drain gate transistor field oxide region.

42. The method of claim 35, wherein the step of implanting the P-type dopant comprises the step of diffusing the P-type dopant into the substrate below the select drain gate transistor field oxide region.

43. The method of claim 35, further comprising the step of etching the polysilicon layer to form the select drain gate strip and the select source gate strip.

44. The method of claim 35, further comprising the step of implanting the P-type dopant into the substrate below the select source gate transistor field oxide region at a tilt angle of at least 8° with respect to the field oxide surface.

45. The method of claim 44, wherein the select drain gate strip and the select source gate strip are disposed opposite each other on a semiconductor wafer, further comprising the step of rotating the semiconductor wafer by about 180° between the step of implanting the P-type dopant into the substrate below the select drain gate transistor field oxide region and the step of implanting the P-type dopant into the substrate below the select source gate transistor field oxide region.

46. The method of claim 35, wherein the tilt angle is between 35° and 65°.

47. The method of claim 35, wherein the substrate has a lattice orientation with respect to the field oxide surface, and wherein the tilt angle is independent of the lattice orientation.

48. The method of claim 35, wherein the non-volatile memory comprises a NAND device.

49. The method of claim 35, wherein the step of implanting the P-type dopant is performed with an implant energy between 80 KeV and 120 KeV.

50. The method of claim 35, wherein the step of implanting the P-type dopant is performed with an implant dose between $3 \times 10^{13}$ cm$^{-2}$ and $4 \times 10^{13}$ cm$^{-2}$.

51. A method of fabricating a NAND device on a substrate of a semiconductor wafer, the NAND device having a characteristic of a high field threshold voltage for preventing field turn-on, the method comprising the steps of:
(a) providing a field oxide on the substrate, the field oxide comprising a select drain gate transistor field oxide region and a core field oxide region having a field oxide surface;
(b) forming a select drain gate strip on the select drain gate transistor field oxide region; and
(c) implanting a P-type dopant into the substrate below the select drain gate transistor field oxide region through the field oxide surface at a tilt angle of at least 8° with respect to the field oxide surface.

52. The method of claim 51, wherein the P-type dopant comprises boron (B).

53. The method of claim 51, wherein the P-type dopant comprises an element selected from the group consisting of boron (B), aluminum (Al), gallium (Ga), indium (In) and thallium (Tl).

54. The method of claim 51, wherein the step of implanting the P-type dopant comprises the step of ion implanting the P-type dopant into the substrate below the select drain gate transistor field oxide region.

55. The method of claim 51, wherein the step of implanting the P-type dopant comprises the step of diffusing the P-type dopant into the substrate below the select drain gate transistor field oxide region.

56. The method of claim 51, wherein the step of forming the select drain gate strip comprises the step of etching a polysilicon layer on the field oxide prior to the step of implanting the P-type dopant.

57. The method of claim 56, further comprising the step of providing a photoresist mask on the polysilicon layer prior to the step of etching the polysilicon layer.

58. The method of claim 56, further comprising the step of forming a select source gate strip disposed opposite the select drain gate strip.

59. The method of claim 51, wherein the NAND device further comprises a select source gate strip disposed opposite the select drain gate strip, and wherein the field oxide further comprises a select source gate transistor field oxide region below the select source gate strip.

60. The method of claim 59, further comprising the step of implanting the P-type dopant into the substrate below the select source gate transistor field oxide region at a tilt angle of at least 8° with respect to the field oxide surface.

61. The method of claim 60, further comprising the step of rotating the semiconductor wafer by about 180° between the step of implanting the P-type dopant into the substrate below the select drain gate transistor field oxide region and the step of implanting the P-type dopant into the substrate below the select source gate transistor field oxide region.

62. The method of claim 51, wherein the tilt angle is between 35° and 65°.

63. The method of claim 51, wherein the substrate has a lattice orientation with respect to the field oxide surface, and wherein the tilt angle is independent of the lattice orientation.

64. The method of claim 51, wherein the step of implanting the P-type dopant is performed with an implant energy between 80 KeV and 120 KeV and an implant dose between $3 \times 10^{13}$ cm$^{-2}$ and $4 \times 10^{13}$ cm$^{-2}$.

65. A method of fabricating a NAND device on a substrate of a semiconductor wafer, with a field oxide disposed on the substrate, the field oxide including a select drain gate transistor field oxide region and a core field oxide region having a field oxide surface, and the NAND device having a characteristic of a high field threshold voltage for preventing field turn-on under the select drain gate transistor field oxide region, the method comprising the step of:

implanting a P-type dopant selected from the group consisting of boron (B), aluminum (Al), gallium (Ga), indium (In) and thallium (Tl) into the substrate below the select drain gate transistor field oxide region at a tilt angle of at least 8° with respect to the field oxide surface.

66. The method of claim 65, wherein the step of implanting the P-type dopant comprises the step of ion implanting the P-type dopant into the substrate below the select drain gate transistor field oxide region.

67. The method of claim 65, wherein the step of implanting the P-type dopant comprises the step of diffusing the P-type dopant into the substrate below the select drain gate transistor field oxide region.

68. The method of claim 65, further comprising the step of etching a polysilicon layer on the field oxide to form a select drain gate strip on the select drain gate transistor field oxide region prior to the step of implanting the P-type dopant.

69. The method of claim 68, further comprising the step of providing a photoresist mask on the polysilicon layer prior to the step of etching the polysilicon layer.

70. The method of claim 68, wherein the step of etching the polysilicon layer further comprises the step of etching the polysilicon layer to form a select source gate strip disposed opposite the select drain gate strip, and wherein the field oxide further comprises a select source gate transistor field oxide region below the select source gate strip.

71. The method of claim 65, wherein the NAND device further comprises a select source gate strip and a select drain gate strip disposed opposite each other, wherein the select drain gate transistor field oxide region is positioned below the select drain gate strip, and wherein the field oxide further comprises a select source gate transistor field oxide region below the select source gate strip.

72. The method of claim 71, further comprising the step of implanting the P-type dopant into the substrate below the select source gate transistor field oxide region at a tilt angle of at least 8° with respect to the field oxide surface.

73. The method of claim 72, further comprising the step of rotating the semiconductor wafer by about 180° between the step of implanting the P-type dopant into the substrate below the select drain gate transistor field oxide region and the step of implanting the P-type dopant into the substrate below the select source gate transistor field oxide region.

74. The method of claim 65, wherein the tilt angle is between 35° and 65°.

75. The method of claim 65, wherein the substrate has a lattice orientation with respect to the field oxide surface, and wherein the tilt angle is independent of the lattice orientation.

76. The method of claim 65, wherein the step of implanting the P-type dopant is performed with an implant energy between 80 KeV and 120 KeV and an implant dose between $3 \times 10^{13}$ cm$^{-2}$ and $4 \times 10^{13}$ cm$^{-2}$.

77. A method of fabricating a non-volatile memory, comprising the steps of:

(a) providing a substrate on a semiconductor wafer;

(b) providing a field oxide on the substrate, the field oxide including a core field oxide region having a field oxide surface, a select drain gate transistor field oxide region and a select source gate transistor field oxide region;

(c) providing a polysilicon layer on the field oxide;

(d) etching the polysilicon layer to form a select drain gate strip and a select source gate strip disposed opposite each other, the core field oxide region positioned between the select drain gate strip and the select source gate strip, the select drain gate strip positioned on the select drain gate transistor field oxide region, and the select source gate strip positioned on the select source gate transistor field oxide region;

(e) implanting a P-type dopant selected from the group consisting of boron (B), aluminum (Al), gallium (Ga), indium (In) and thallium (Tl) into the substrate below the select drain gate transistor field oxide region through the field oxide surface and the select drain gate transistor field oxide region at a tilt angle of at least 8° with respect to the field oxide surface;

(f) rotating the semiconductor wafer by about 180°; and (g) implanting the P-type dopant into the substrate below the select source gate transistor field oxide region through the field oxide surface and the select source gate transistor field oxide region at a tilt angle of at least 80 with respect to the field oxide surface.

78. The method of claim 77, further comprising the step of providing a photoresist mask on the polysilicon layer prior to the step of etching the polysilicon layer to form the select drain gate strip and the select source gate strip.

79. The method of claim 77, wherein the step of implanting the P-type dopant into the substrate below the select drain gate transistor field oxide region comprises the step of ion implanting the P-type dopant into the substrate below the select drain gate transistor field oxide region, and wherein the step of implanting the P-type dopant into the substrate below the select source gate transistor field oxide region comprises the step of ion implanting the P-type dopant into the substrate below the select source gate transistor field oxide region.

80. The method of claim 77, wherein the step of implanting the P-type dopant into the substrate below the select drain gate transistor field oxide region comprises the step of diffusing the P-type dopant into the substrate below the select drain gate transistor field oxide region, and wherein the step of implanting the P-type dopant into the substrate below the select source gate transistor field oxide region comprises the step of diffusing the P-type dopant into the substrate below the select source gate transistor field oxide region.

81. The method of claim 77, wherein the tilt angle is between 35° and 65°.

82. The method of claim 77, wherein the substrate has a lattice orientation with respect to the field oxide surface, and wherein the tilt angle is independent of the lattice orientation.

83. The method of claim 77, wherein the step of implanting the P-type dopant is performed with an implant energy between 80 KeV and 120 KeV and an implant dose between $3 \times 10^{13}$ cm$^{-2}$ and $4 \times 10^{13}$ cm$^{-2}$.

\* \* \* \* \*

UNITED STATES PATENT AND TRADEMARK OFFICE
CERTIFICATE OF CORRECTION

PATENT NO. : 6,146,944
DATED : November 14, 2000
INVENTOR(S) : He et al.

It is certified that error appears in the above-identified patent and that said Letters Patent is hereby corrected as shown below:

Title page,
After "5,851,886 12/1998 .................. 438/289" please insert:
-- OTHER PUBLICATIONS
Wolf, et al., "Silicon Processing for the VLSI Era Volume 1: Process Technology," pp. 292-294, 1986. --

Claim 77,
Line 29, delete "80" and substitute therefor -- 8° --.

Signed and Sealed this

Sixth Day of November, 2001

Attest:

NICHOLAS P. GODICI
Attesting Officer
Acting Director of the United States Patent and Trademark Office